(12) United States Patent
Shim et al.

(10) Patent No.: US 7,948,255 B2
(45) Date of Patent: May 24, 2011

(54) TEST HANDLER

(75) Inventors: Jae-Gyun Shim, Suwon-si (KR); Yun-Sung Na, Cheunan-si (KR); In-Gu Jeon, Suwon-si (KR); Tae-Hung Ku, Suwon-si (KR)

(73) Assignee: TechWing Co., Ltd, Hwaseung-si (KR)

( * ) Notice: Subject to any disclaimer, the term of this patent is extended or adjusted under 35 U.S.C. 154(b) by 499 days.

(21) Appl. No.: 11/997,974

(22) PCT Filed: Aug. 14, 2006

(86) PCT No.: PCT/KR2006/003178
§ 371 (c)(1),
(2), (4) Date: Mar. 5, 2008

(87) PCT Pub. No.: WO2007/021112
PCT Pub. Date: Feb. 22, 2007

(65) Prior Publication Data
US 2008/0193271 A1    Aug. 14, 2008

(30) Foreign Application Priority Data
Aug. 18, 2005  (KR) .................. 10-2005-0075534

(51) Int. Cl.
*G01R 31/20* (2006.01)
*G01R 31/00* (2006.01)

(52) U.S. Cl. .................. 324/757.01; 324/756.07
(58) Field of Classification Search .............. None
See application file for complete search history.

(56) References Cited

U.S. PATENT DOCUMENTS

| 5,307,011 A | 4/1994 | Tani |
| 2005/0168214 A1* | 8/2005 | Kim .................. 324/158.1 |
| 2007/0018673 A1 | 1/2007 | Hsieh |

FOREIGN PATENT DOCUMENTS

| JP | 11-297791 | 10/1999 |
| KR | 1020000010422 A | 2/2000 |
| KR | 10200030090881 A | 12/2003 |

* cited by examiner

Primary Examiner — Roberto Velez
(74) Attorney, Agent, or Firm — Jefferson IP Law, LLP

(57) ABSTRACT

A test handler is disclosed. The test handler includes first to third transfers for transferring a user tray, and first to third horizontal movement units suitable for respectively moving the first to third transfers in the horizontal direction. The first to third horizontal movement units are independently operated such that each of the first to third transfers can perform independently horizontal movements. Each of the first to third transfers performs based on its previously allocated function, thereby enhancing test process speed for devices.

3 Claims, 4 Drawing Sheets

[FIG. 1]
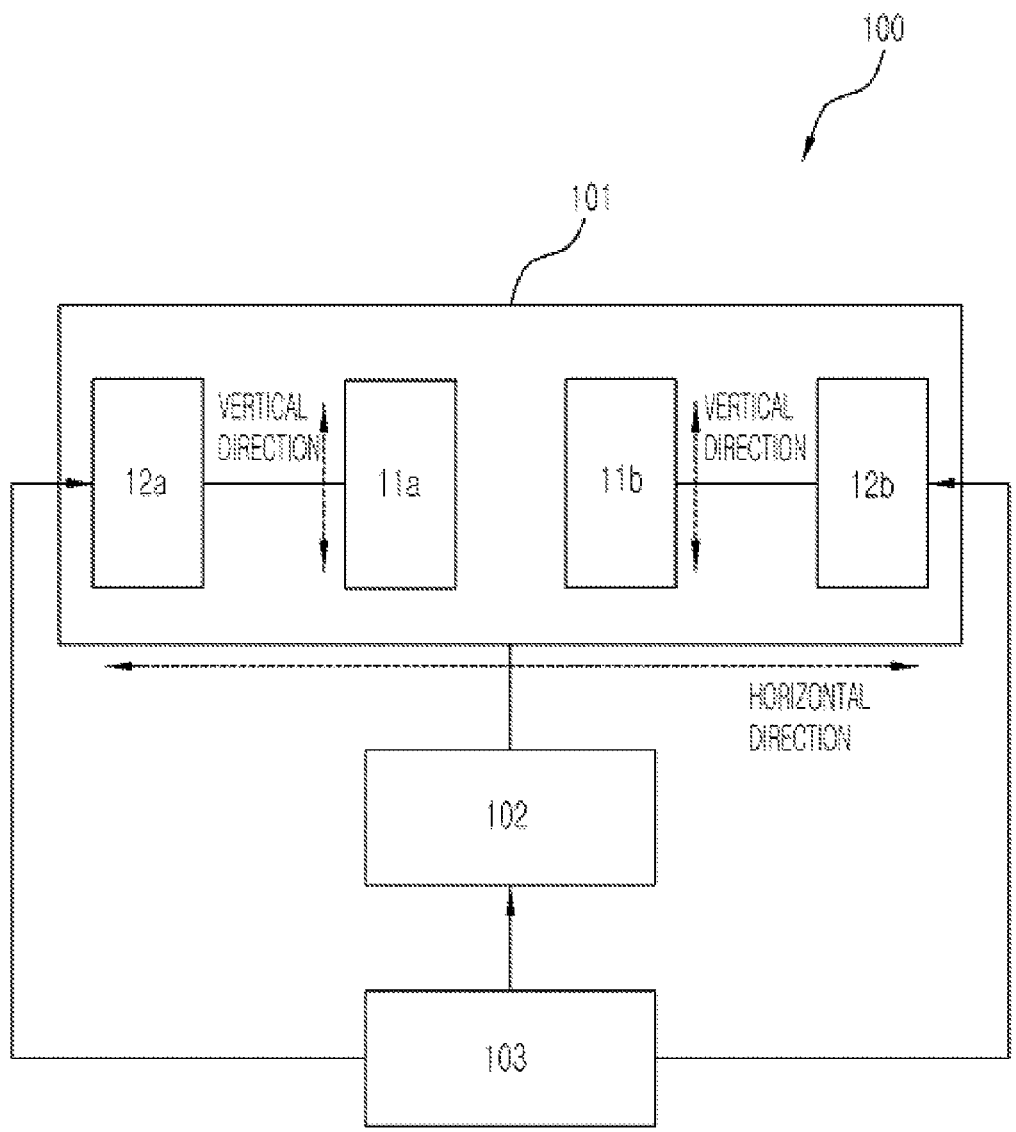
PRIOR ART

[Fig. 2]
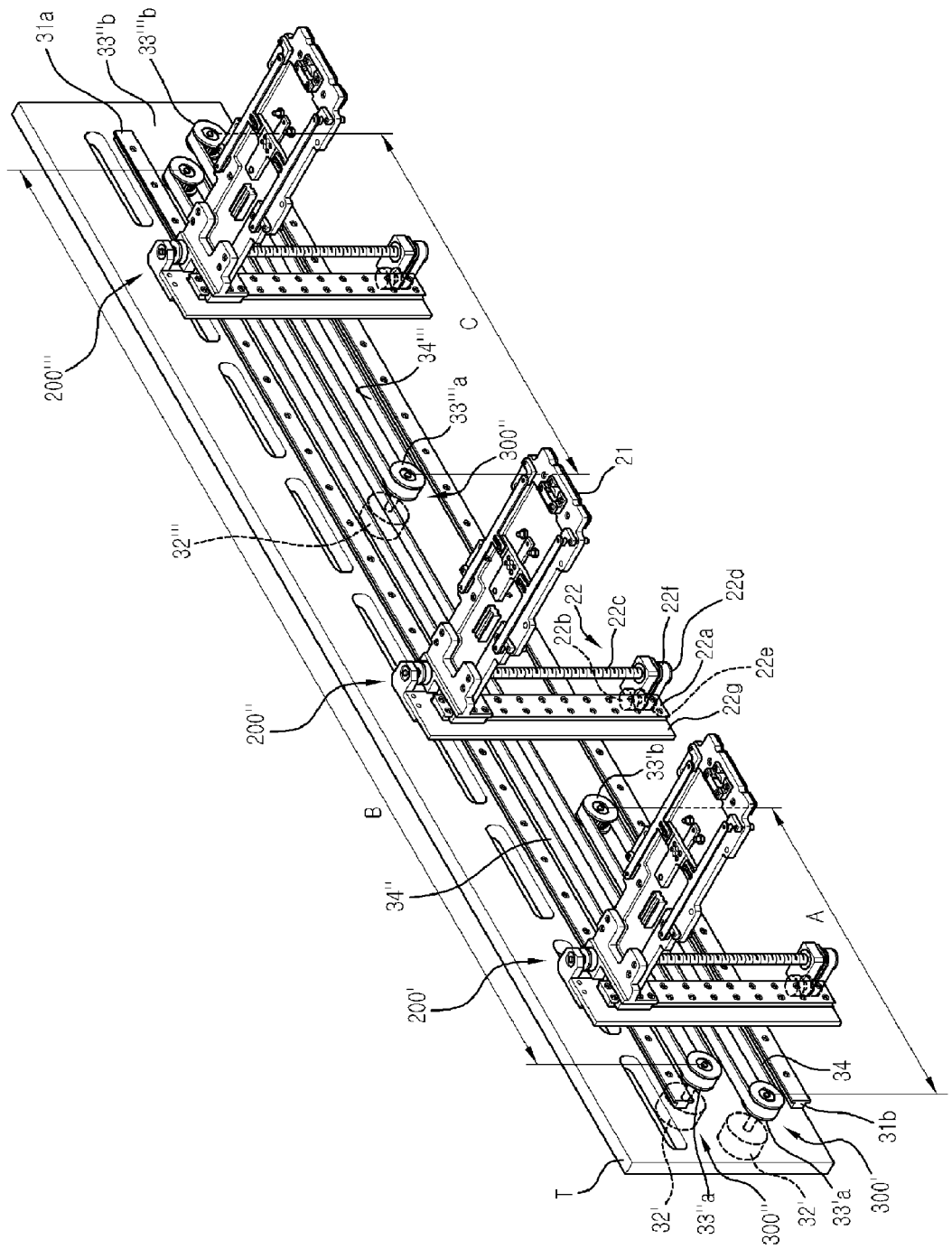

[Fig. 3]
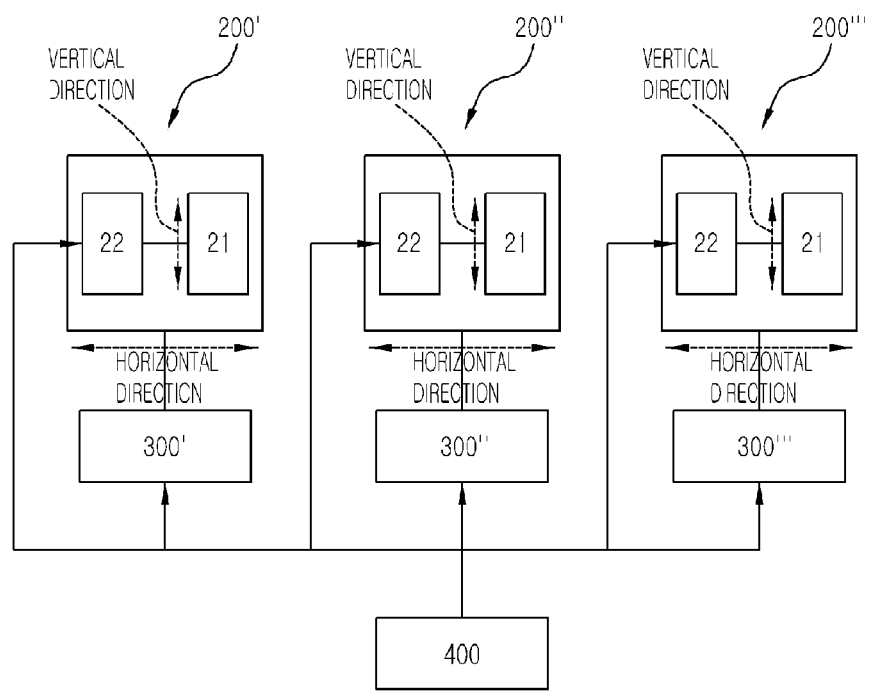
[Fig. 4]
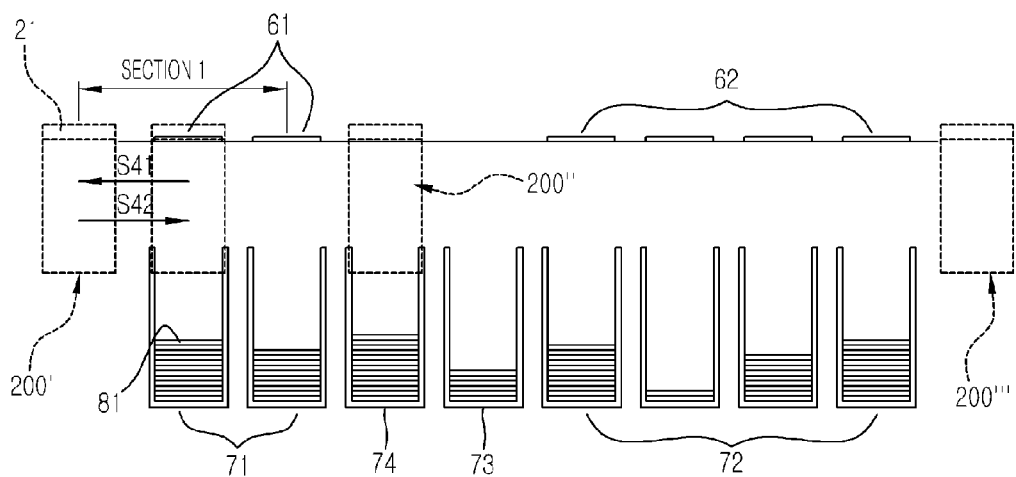

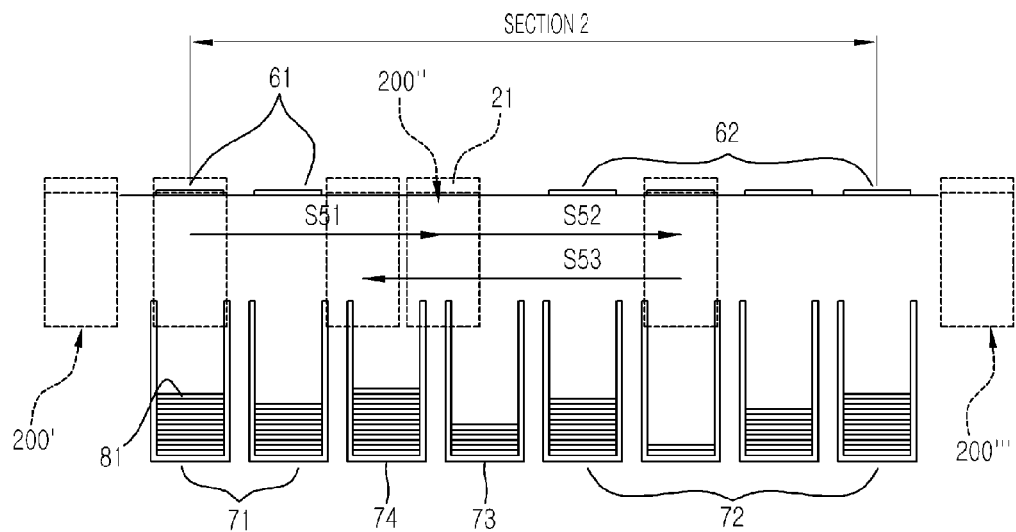
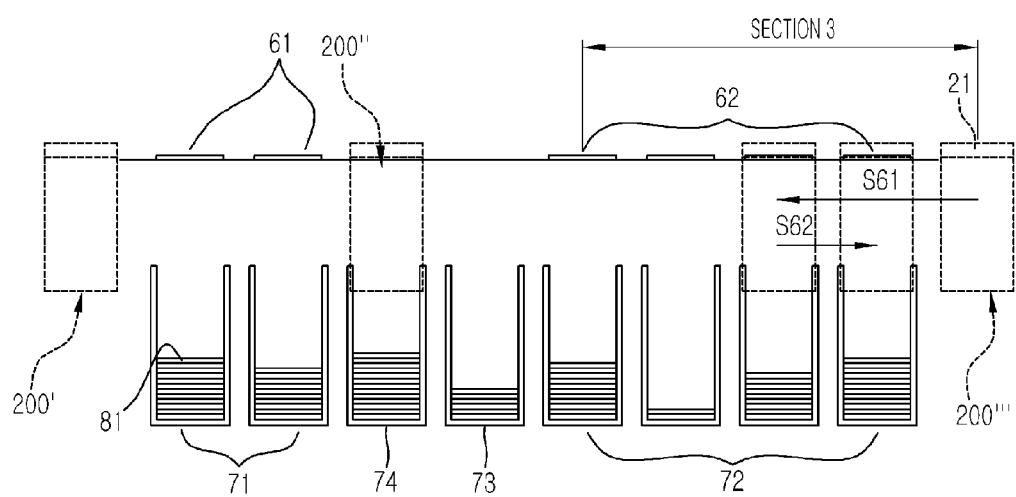

TEST HANDLER

TECHNICAL FIELD

The present invention relates to a test handler, and more particularly to a tray transfer apparatus which is capable of transferring a user tray.

BACKGROUND ART

Recently, semiconductor devices (which is hereinafter called a 'device') are used in various environments. It is critical for the device to be able to perform even under adverse conditions. Therefore, before selling the device on the market, it must undergo tests of how they can perform under adverse conditions. A test handler according to the present invention serves to determine whether the states of produced devices are good or bad under a particular condition, before they are presented to market. The procedure referred to above is a method for testing these devices.

The technologies related to the test handler are disclosed in: Korean Utility Model Publication No. 1998-062568 entitled TRAY CATCHER OF HANDLER SYSTEM FOR TESTING SEMICONDUCTOR DEVICE; Korean Utility Model Publication No. 1998-062567 entitled TRANSFER APPARATUS OF HANDLER SYSTEM; Korean Patent No. 2003-0062702 entitled TRAY TRANSFER APPARATUS OF TEST HANDER FOR SEMICONDUCTOR DEVICE; Korean Patent Publication No. 10-2004-0043925 entitled TRAY TRANSFER APPARATUS; Korean Patent No. 2002-0031461 entitled TRAY TRANSFER APPARATUS FOR HANDLER; and Korean Patent No. 2003-0029266 entitled TEST HANDLER. These publication materials disclose structures of test handler in detail.

As disclosed in the publication materials, the test handler includes a tray transfer apparatus for transferring a user tray under a transfer standby state to a transfer position as the tray transfer apparatus grips one of a plurality of user trays loaded in stackers which are installed under the loading plates and unloading plates. Then it performs a movement to transfer the gripped user tray to the loading plate and unloading plate or the tray transfer apparatus grips a user tray, which is located at the loading plate and unloading plate, to perform a movement to stack the gripped user tray on the stacker. The present invention relates to technical characteristics of the tray transfer apparatus. Here, the word transfer standby state means states where a user tray must be transferred, such as, a state where a corresponding user tray is loaded on the stacker when the user tray includes a target device to be tested, or a state where a corresponding user tray is located at the loading or unloading plate immediately after finishing a loading or unloading operation. Also, the transfer position means positions to which a user tray under the transfer standby state must be transferred, such as, a position of a loading plate for a user tray in which a target device to be tested is included, where the user tray is loaded on the stacker, or a position of a unloading plate for an empty user tray which finishes a loading operation in the loading plate. Such concepts will be identically applied to the following description.

FIG. 1 is a block diagram illustrating a tray transfer apparatus 100 of a conventional test handler. Referring to FIG. 1, the conventional tray transfer apparatus 100 includes a transfer 101 having a pair of grippers 11a and 11b which selectively grip or un-grip a user tray and a pair of vertical movement units 12a and 12b which vertically move the pair of grippers 11a and 11b, respectively, a horizontal movement unit 102 which horizontally moves the transfer 101, and a controller 103 which controls the pair of vertical movement units 12a and 12b and the vertical movement unite 102. The conventional tray transfer apparatus 100 was disclosed, in detail, in FIG. 2 and the description related thereto in Korean Utility Model Publication No. 1998-062567 (which is hereinafter referred to as cited reference). In the cited reference, the tray transfer apparatus was just expressed as a transfer apparatus and a pair of grippers was expressed as a transfer head.

However, since the pair of grippers 11a and 11b are independently moved in the vertical direction and are always moved together in the horizontal direction, when events (which means a state where a user tray is in a transfer standby state as the user tray on a loading plate or an unloading plate completely performs a loading or unloading, whose meaning will be identically applied to the following descriptions) simultaneously occur on the loading plate and the unloading plate, a user tray under a transfer standby state on one of them must keep its state. Therefore, the conventional tray transfer apparatus 100 is disadvantageous in that its process speed decreases.

Also, since the conventional tray transfer apparatus 100 is implemented in a single transfer 101 together with other elements, a pair of grippers 11a and 11b perform all of transferring operations while moving together in the horizontal direction. In addition, because it is difficult to know that an event occurs at which one of a loading plate or an unloading plate, the conventional tray transfer apparatus cannot perform gripping, moving and waiting operations without preceding procedures. Namely, the apparatus cannot perform moving and waiting operations without preceding procedures while it grips a user tray under a transfer standby state. Therefore, the conventional tray transfer apparatus is disadvantageous in that the process speed decreases.

In addition, since all of the pairs of grippers 11a and 11b must be moved horizontally from the loading plate section to the unloading plate section, the horizontal movement distance is relatively elongated. Therefore, the conventional tray transfer apparatus is disadvantageous in that the process speed decreases.

The above-mentioned problems are more seriously shown in this field because technologies for test handlers will be developed such that the test handlers can process devices with large capacity.

DISCLOSURE OF INVENTION

Technical Problem

Therefore, the present invention has been made in view of the above problems, and it is an object of the present invention to provide a test handler including three transfers each of which has a gripper and a vertical movement unit suitable for moving the gripper in the vertical direction, where the three transfers can move independently in the horizontal direction.

It is another object of the present invention to provide a test handler including three transfers which can independently move in the horizontal direction. The respective three transfers are assigned by respective functions, such that previously-allocated procedures can be performed by them respectively before generation of an event, thereby reducing the movement distances of the respective transfers.

Technical Solution

In accordance with an aspect of the present invention, the above and other objects can be accomplished by the provision of a test handler test handler including first to third transfers and first to third horizontal movement devices. Each transfer includes a gripper suitable for selectively gripping and ungripping a user tray; and a vertical movement unit suitable for moving the gripper in the vertical direction, wherein the first to third transfers are aligned in the horizontal direction in that order. The first to third horizontal movement units are suitable for respectively moving the first to third transfers in the horizontal direction, wherein the first to third horizontal movement units can be independently operated.

Preferably, the first transfer performs a horizontal movement within a first section, and the third transfer performs a horizontal movement within a third section, which is separated from the first section. Therefore, the horizontal movement distance of each transfer can be reduced, and thus the transfer speed of the user tray is rapid.

In accordance with another aspect of the present invention, there is provided to a test handler including first to third transfers. Here, the first transfer is suitable for gripping a first subject user tray that has therein a plurality of target devices to be tested, and then putting the first subject user tray onto one of loading plates. The second transfer is suitable for gripping a second subject tray from one of the loading plates after the second subject user tray is made empty by transferring a plurality of target devices therein to a test tray, and then putting the second subject user tray onto one of unloading plates. The third transfer is suitable for gripping a third subject user tray from one of the unloading plates after a plurality of tested devices are loaded therein, and then stacking the third subject user tray in one of stackers, wherein the first to third transfers can be independently moved in the horizontal direction.

Preferably, the first transfer waits near the loading plates after gripping the first subject user tray having therein a plurality of target devices to be tested, while the second transfer is gripping the second subject user tray, having been made empty, from one of the loading plates; and then the first transfer puts the first subject user tray onto the one of the loading plates after second transfer finishes gripping the second subject user tray.

Preferably, the second transfer waits near the unloading plate after gripping the second subject user tray having been made empty, while the third transfer is gripping the third subject user tray, having a plurality of tested devices loaded therein, from one of the unloading plates; and then the second transfer puts the second subject user tray onto the one of the unloading plates after the third transfer finished gripping the third subject user tray.

In accordance with further aspect of the present invention, there is provided to a test handler including first to third transfers. Here, the first transfer is suitable for: gripping a first user tray from a stacker, the first user tray having therein a plurality of target devices to be tested; waiting near loading plates while still gripping the first user tray; putting the first user tray onto one of the loading plates after an empty user tray is removed from the one of loading plates; moving towards the stacker again to grip another first user tray having therein a plurality of target devices to be tested; waiting near the loading plates while still gripping the another first user tray. The second transfer is suitable for: waiting near unloading plates while gripping a second user tray from one of the loading plates, the second user tray having been made empty by transferring a plurality of target devices therein to a test tray; putting the second user tray onto one of the unloading plates after a loaded user tray having a plurality of tested devices loaded therein is removed from one of the unloading plate; waiting again near the loading plates to grip another second user tray from one of the loading plates The third transfer is suitable for: waiting near the unloading plates; gripping a third user tray from one of the unloading plates, the third user tray having a plurality of tested devices loaded thereto; waiting again near the unloading plates to grip another third user tray from one of the unloading plates, Here, the first to third transfers can be independently moved in the horizontal direction.

In accordance with still further aspect of the present invention, there is provided to a test handler including at least two transfers for respectively transferring a user tray under a transfer standby state to a target position, at least two horizontal movement units, and a controller. Here, each transfer includes: a gripper suitable for selectively gripping and ungripping a user tray; and a vertical movement unit suitable for moving the gripper in a vertical direction. At least two horizontal movement units is prepared corresponding to the at least two transfers for horizontally moving the at least two transfers, respectively. The controller independently controls operations of at the least two vertical movement units respectively provided for the at least two transfers and makes the at least two horizontal movement units can be independently operated from each other, thereby enabling the at least two transfers to independently perform horizontal movements.

Preferably, the at least two transfers include a first transfer suitable for transferring a first user tray from a stacker to one of the loading plates; a second transfer suitable for transferring a second user tray from one of the loading plates to one of unloading plates after the second user tray on the one of the loading plates has been made empty by transferring a plurality of target devices therein to a test tray; and a third transfer suitable for transferring a third user tray from one of the unloading plates to one of stackers after a plurality of tested devices has been loaded into the third user tray on the unloading plate.

In accordance with yet another aspect of the present invention, there is provided to a test handler including at least two transfers, at least n two horizontal movement units, and a controller. Here, the at least two transfers are configured such that they can be moved within different horizontal movement sections, respectively, to transfer a user tray under a transfer standby state to a transfer position. The at least two horizontal movement units are installed corresponding to the at least two transfers, such that they can horizontally move the at least two transfers within horizontal movement sections in which the transfers are located, respectively.

ADVANTAGEOUS EFFECTS

As apparent from the above description, the present invention provides a test handler including three transfers each of which has a gripper and a vertical movement unit which moves the gripper in the vertical direction, where the three transfers independently move in the horizontal direction, each transfer has a function such that a previous procedure can be performed before an event occurs, and horizontal movement distance is divided on the basis of functions of the respective transfers such that the respective transfers can move quickly, thereby enhancing process speed thereof due to movement of user trays.

BRIEF DESCRIPTION OF THE DRAWINGS

The above and other objects, features and other advantages of the present invention will be more clearly understood from the following detailed description taken in conjunction with the accompanying drawings, in which:

FIG. 1 is a block diagram illustrating a tray transfer apparatus of a conventional test handler;

FIG. 2 is a perspective view illustrating primary parts of a test handler according to the present invention;

FIG. 3 is a block diagram illustrating primary parts of the test handler according to the present invention; and FIG. 4 to FIG. 6 are views illustrating operation states of the test handler according to the present invention.

BEST MODE FOR CARRYING OUT THE INVENTION

The present invention will be now described in detail with reference to the accompanying drawings, in which preferred embodiments of the present invention are shown.

FIG. 2 is a perspective view illustrating primary parts of a test handler according to the present invention, and FIG. 3 is a block diagram illustrating primary parts of the test handler according to the present invention.

Referring to FIG. 2 and FIG. 3, the test handler according to the present invention includes three transfers 200', 200", and 200''', three horizontal movement units 300', 300'', and 300''', and a controller. The three transfers 200', 200'', and 200''' transfer user trays under a transfer standby state to a transfer position, and the three horizontal movement units 300', 300'', 300''' independently move the three transfers 200', 200'' and 200''' in the horizontal direction. On the other hand, symbol 'T,' which is not described in detail, indicates an installation plate on which all of the elements are installed.

The following will describe the configuration of the test handler in detail.

The three transfers 200', 200'', and 200''' will be renamed as follows: reference numeral 200' is referred to as a first transfer suitable for performing a movement operation within a first section A; reference numeral 200'' is referred to as a second transfer suitable for performing a movement operation within a second section B; and 200'' is referred to as a third transfer suitable for performing a movement operation within a third section C. Each of the first to third transfers 200', 200'' and 200'''includes a gripper 21 suitable for selectively gripping and un-gripping a user tray, and a vertical movement unit 22 suitable for moving the gripper 21 in the vertical direction.

The gripper 21 will not be fully described in this application because the configuration thereof was described in the cited reference in detail.

The vertical movement unit 22 includes a vertical guide rail 22a enabling the gripper 21 to move up and down in the vertical direction therealong, a motor 22b supplying mechanical power thereto such that the gripper 21 can perform a vertical direction movement. Also, in order to transfer the mechanical power of the motor 22b to the gripper 21, the vertical movement unit 22 includes a transfer shaft 22c, a pulley 22d installed at one end of the transfer shaft 22c, a motor pulley 22e installed at the rotation shaft of the motor 22b, and a belt 22f connecting the pulley 22d to the motor pulley 22e. In addition, the vertical movement unit 22 further includes a holding plate 22g holding the vertical guide rail 22a. Therefore, the vertical movement unit 22 enables the gripper 21 to move up and down as the mechanical power of the motor 22b is transferred to the gripper 21 through the motor pulley 22e, pulley 22d and transfer shaft 22c, according to forward and backward rotations of the motor 22b.

Although the gripper 21 and the vertical movement unit 22 are installed at each of the first to third transfers 200', 200'' and 200''', the other grippers and vertical movement units of the first to third transfers 200', 200'' and 200''' are numbered by the same figures as 21 and 22 in FIG. 2, for brief description.

On the other hand, the three horizontal movement units 300', 300'', and 300''' will be renamed as follows: reference numeral 300' is referred to as a first horizontal movement unit which can move the first transfer 200' in the horizontal direction within the first section A; reference number 300'' is referred to as a second horizontal movement unit which can move the second transfer 200'' in the horizontal direction within the second section B, and reference numeral 300''' is referred to as a third horizontal movement unit which can move the third transfer 200''' in the horizontal direction within the third section C.

More specifically, the first horizontal movement unit 300' horizontally moves the first transfer 200' within the first section A such that the first transfer 200' can transfer a user tray (not shown) under a transfer standby state onto the loading plate. The user tray includes one of a plurality of target devices to be tested (not shown), which are stacked on a stacker (not shown). The stacker is located under the loading plate. To this end, the first horizontal movement unit 300' includes: horizontal guide rails 31a and 31b which guide a holding plate 22g of the first transfer 200' such that the holding plate 22g can perform a horizontal movement; a first motor 32' supplying mechanical power for the horizontal movement of the first transfer 200' thereto; a first a pulley 33'a installed to the rotation shaft of the first motor 32'; a first b pulley 33'b installed to a corresponding place which is apart from the first a pulley 33'a in the horizontal direction; and a first belt 34' connecting the first a pulley 33'a, the first b pulley 33'b and the holding plate 22g of the first transfer 200' to each other. Here, as shown in FIG. 2, the first a pulley 33'a is located at one end of the first section A and the first b pulley 33'b is located at the other end.

The second horizontal movement unit 300'' horizontally moves the second transfer 200'' within the second section B in the horizontal direction, such that the second transfer 200'' can transfer an empty user tray under a transfer standby state on the loading plate from a gripping position to a transfer position where the empty user tray on an unloading plate is located. Here, the second section B is from the gripping position to the transfer position. To this end, the second horizontal movement unit 300'' includes: horizontal guide rails 31a and 31b which guide a holding plate 22g of the second transfer 200'' such that the holding plate 22g can perform a horizontal movement; a second motor 32'' supplying mechanical power for the horizontal movement of the second transfer 200'' thereto; a second a pulley 33''a installed to the rotation shaft of the second motor 32''; a second b pulley 33''b installed to a corresponding place which is apart from the second a pulley 33''a in the horizontal direction; and a second belt 34'' connecting the second a pulley 33''a, the second b pulley 33''b and the holding plate 22g of the second transfer 200'' to each other. Here, as shown in FIG. 2, the second a pulley 33''a is located at one end of the second section B and the second b pulley 33''b is located at the other end. Although the present embodiment is implemented such that first to third horizontal movement units can share the horizontal guide rails 31a and 31b, person skilled in the art will easily appreciate that the embodiment can be modified such that each of the horizontal movement units can employ the respective horizontal guide rails.

The third horizontal movement unit 300''' horizontally moves the third transfer 200'''within the third section C, such that the third transfer 200''' can transfer a user tray (on which test-finished devices are included) from a position on an unloading plate to a transfer position, while the tray is under a transfer standby state, such that the test-finished devices can be loaded to a stacker installed under the unloading plate. To this end, the third horizontal movement unit 300''' includes: horizontal guide rails 31a and 31b which guide a holding plate 22g of the third transfer 200''' such that the holding plate 22g can perform a horizontal movement; a third motor 32''' supplying mechanical power for the horizontal movement of the third transfer 200''' thereto; a third a pulley 33'''a installed to the rotation shaft of the third motor 32'''; a third b pulley 33'''b installed to a corresponding place which is apart from the third a pulley 33'''a in the horizontal direction; and a third belt 34''' connecting the third a pulley 33'''a, the third b pulley 33'''b and the holding plate 22g of the third transfer 200''' to each other. Here, as shown in FIG. 2, the third a pulley 33'''a is located at one end of the third section C and the third b pulley 33'''b is located at the other end.

The first to third horizontal movement units 300', 300'' and 300''' are operated such that: when the respective first to third motors 32', 32'' and 32''' are operated according to control of the controller 400, corresponding pulleys (33'a, 33'b; 33''a, 33''b; 33'''a, 33'''b) and belts (34'; 34''; 34''') are also operated together, and accordingly the holding plate 22g of each of the first to third transfers 200', 200'' and 200''' is guided by the horizontal guide rails 31a and 31b, thereby smoothly moving the first to third transfers 200', 200'' and 200''' in the horizontal direction.

On the other hand, the controller 400 controls operations of the motor 22b of the vertical movement unit 22 and the first to third motors 32', 32'' and 32''' of the first to third horizontal movement units 300', 300'' and 300''' to control operations of the first to third transfers 200', 200'' and 200'''.

The following is a description for operations of the first to the first transfers 200', 200'' and 200''' which are controlled by the controller 400 as the test handler starts. For convenient description, each of the first to the first transfers 200', 200'' and 200''' will be described, referring to FIG. 4 to FIG. 6 in which only a horizontal movement distance is illustrated.

Operation of First Transfer—FIG. 4

The first transfer 200' grips a user tray 81 that has therein a plurality of target devices to be tested, which is under a transfer standby state, from a stacker 71 located under a loading plate 61, and then waits near the loading plates 61, in step S41 (a gripper 21 is illustrated as it is located beside the left of the loading plate 61 as shown in FIG. 4) while the second transfer 200'', whose description will be described in detail later, is gripping an empty user tray from one of the loading plates 61. Afterward, the first transfer 200' puts the gripped user tray 81 onto the one of the loading plates 61, in step S42, after the second transfer 200'' finishes gripping the empty user tray. After that, the first transfer 200' repeats its operation within the first section.

Operation of Second Transfer—FIG. 5

The second transfer 200'' grips an empty user tray under a transfer standby state from one of the loading plates 61, where the empty user tray is prepared as the plurality of the target devices to the test tray are transferred to the test tray, and then waits near the unloading plates 62, in step S51 (a gripper 21 is illustrated as it is located beside the left of one of the unloading plates 62 as shown in FIG. 5), while the third transfer 200''' (described in detail later) is gripping a user tray, having a plurality of tested devices loaded therein, from one of the unloading plates 62. Afterwards, the second transfer 200'' puts the gripped empty user tray onto the one of the unloading plates 62, in step S52, after the third transfer 20''' finishes gripping the user tray. After that, the second transfer 200'' moves near one of the loading plates 61, again, and waits for the next operation, in step S53 (the gripper 21 is illustrated, in FIG. 5, as it is located beside the right of one of the loading plates). Then, the second transfer 200'' repeats its operations within the second section.

On the other hand, when an event occurs in a state where all of the devices, which are included in the user tray on the loading plate 61, are not loaded onto the test tray, the second transfer 200'' loads a corresponding user tray onto a stacker numbered by 74. Namely, such an operation is performed to prevent that the corresponding user tray moves on the unloading plate while a device remains on the corresponding user tray on the loading plate 61. Here, the embodiment may be modified such that an additional space can receive the corresponding user tray.

Also, when an event occurs on one of the unloading plates 62 while any event does not occur on one of the loading plates 61, the second transfer 200' grips an empty user tray from a stacker numbered by 73, in which empty user trays are stacked, and then transfers the empty user tray onto one of the unloading plates 62 in which the event occurred. Therefore, the unloading operation is smoothly performed without delay.

Operation of Third Transfer—FIG. 6

While the third transfer 200''' waits near one of the unloading plates 62 (the gripper 21 waits beside the right of one of the unloading plates 62 in FIG. 6), when a user tray is shown, where the user tray is under a transfer standby state as the target devices are unloaded to the test tray, the unloaded user tray is gripped, in step S62, and then loaded on a stacker 72 located under one of the unloading plates 62, in step S62. After that, the third transfer 200''' repeats its operation within the third section.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

INDUSTRIAL APPLICABILITY

As described above, according to the present invention, the test handler enhances process speed of user trays based on improvement of movement of the user trays, the present invention can be properly applied to the field of testing semiconductor devices.

The invention claimed is:

1. A test handler comprising:
a first transfer for gripping a first user tray that has therein a plurality of target devices to be tested, and then putting the first user tray onto one of loading plates;
a second transfer for gripping a second user tray from one of the loading plates after the second user tray is made empty by transferring a plurality of target devices therein to a test tray, and then putting the second user tray onto one of unloading plates; and
a third transfer for gripping a third user tray from one of the unloading plates after a plurality of tested devices are loaded therein, and then stacking the third user tray in one of stackers, wherein the first transfer, the second transfer and the third transfer can be independently moved in the horizontal direction, and wherein the first transfer waits near the loading plates after gripping the first user tray having therein a plurality of target devices to be tested, while the second transfer grips the second user tray, having been made empty, from one of the loading plates, and then the first transfer puts the first user tray onto the one of the loading plates after second transfer finishes gripping the second user tray.

2. The test handler according to claim 1, wherein the second transfer waits near the unloading plate after gripping the second user tray having been made empty, while the third transfer grips the third user tray, having a plurality of tested devices loaded therein, from one of the unloading plates, and then the second transfer puts the second user tray onto the one of the unloading plates after the third transfer finishes gripping the third user tray.

3. A test handler comprising:
   a first transfer for gripping a first user tray that has therein a plurality of target devices to be tested, and then putting the first user tray onto one of loading plates;
   a second transfer for gripping a second user tray from one of the loading plates after the second user tray is made empty by transferring a plurality of target devices therein to a test tray, and then putting the second user tray onto one of unloading plates; and
   a third transfer for gripping a third user tray from one of the unloading plates after a plurality of tested devices are loaded therein, and then stacking the third user tray in one of stackers, wherein the first transfer, the second transfer and the third transfer can be independently moved in the horizontal direction, and wherein the second transfer waits near the unloading plate after gripping the second user tray having been made empty, while the third transfer grips the third user tray, having a plurality of tested devices loaded therein, from one of the unloading plates, and then the second transfer puts the second user tray onto the one of the unloading plates after the third transfer finishes gripping the third user tray.

* * * * *